Figure 1:
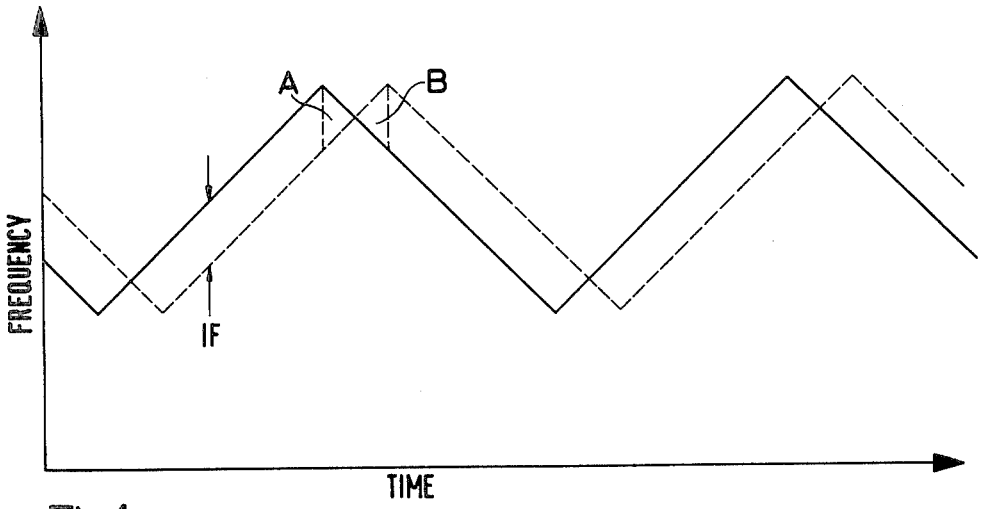
Figure 2:
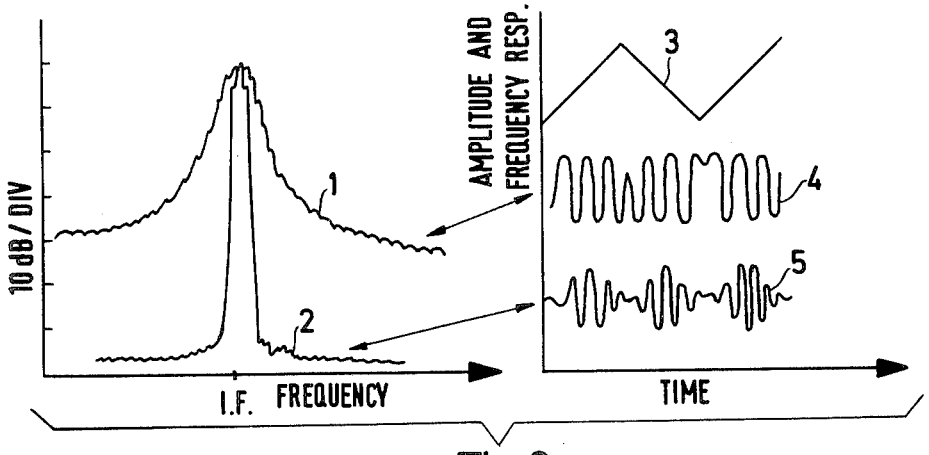
Figure 3:
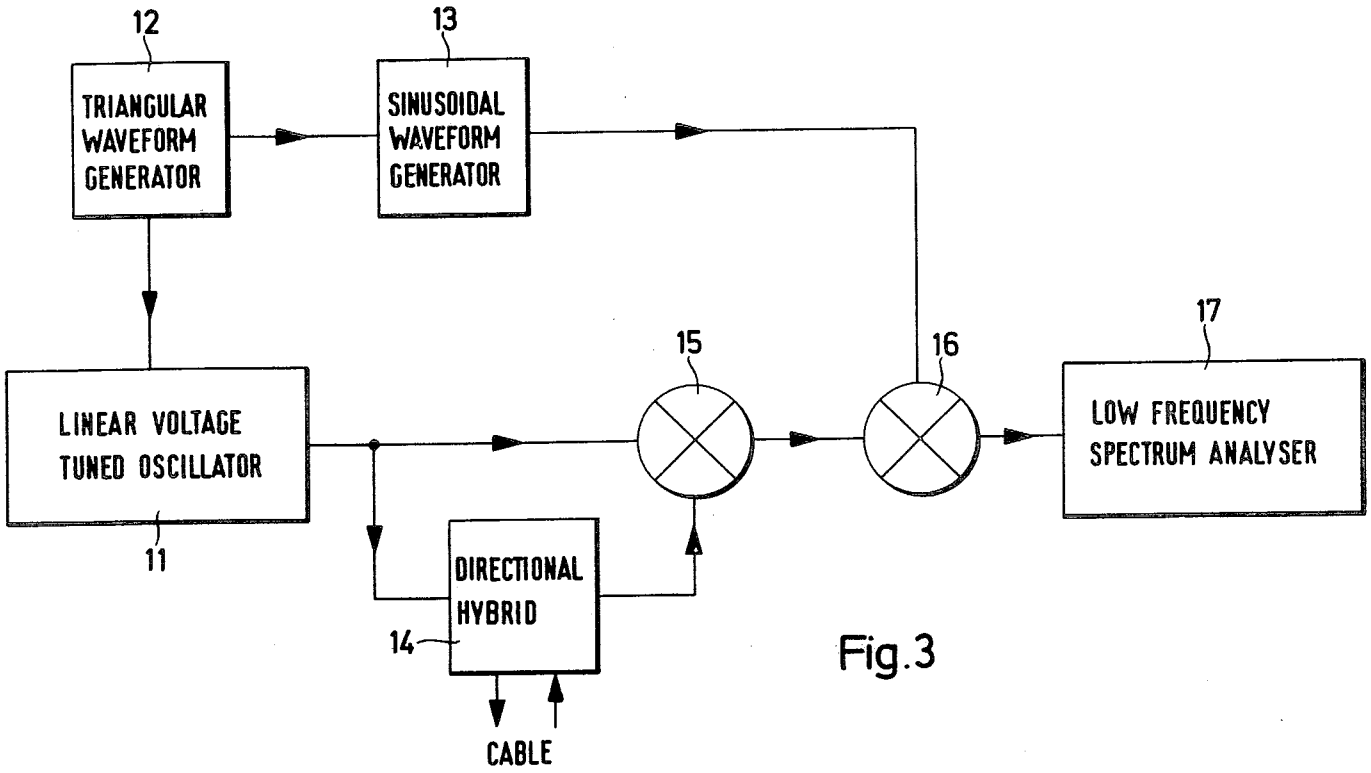

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MARCH 2, 1976

944 O.G. 40

T944,003

METHOD AND APPARATUS FOR MEASURING THE DISTANCE TO DISCONTINUITIES IN A SIGNAL TRANSMITTING MEDIUM

Richard John Roberts, 77 Stewart Clark Ave., South Queensferry, Scotland, and Michael Crabtree, 46 Oatlands Park, Linlithgow, Scotland Filed Oct. 9, 1974, Ser. No. 513,426
Claims priority, application Great Britain, Nov. 9, 1973, 52,057/73
Int. Cl. G01S 9/24
U.S. Cl. 343—14
2 Sheets Drawing. 6 Pages Specification

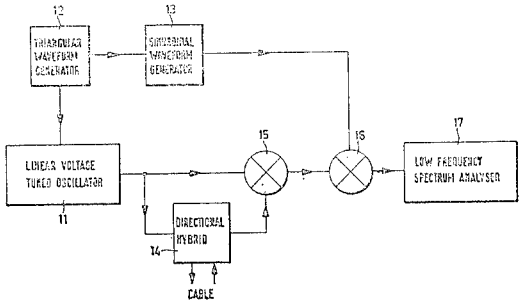

A method for measuring the distance to a discontinuity in a signal transmitting medium such as a cable is disclosed employing a swept frequency reflectometer. A swept frequency signal is transmitted into said medium, and the signal reflected by the discontinuity is received. An intermediate frequency obtained by mixing (in 15) the transmitted and the received signals is proportional to the distance to the discontinuity. Means (13 and 16) are provided for amplitude modulating the intermediate frequency signal at twice the frequency sweep repetition rate and, preferably, with 100% modulation. The modulation signal is phase locked to the frequency sweep repetition rate so that the modulation signal is at a minimum at the extreme points of the sweep. Thereby unwanted sidebands of the intermediate frequency are suppressed to improve the resolution of the reflectance measurement.